US011011728B2

(12) United States Patent
Kwon et al.

(10) Patent No.: US 11,011,728 B2
(45) Date of Patent: May 18, 2021

(54) DISPLAY DEVICE

(71) Applicant: Samsung Display Co., Ltd., Yongin-si (KR)

(72) Inventors: Sun-Ja Kwon, Gunpo-si (KR); Won Kyu Kwak, Seongnam-si (KR); Dong Wook Kim, Asan-si (KR); Han Soo Kim, Asan-si (KR); Ae Shin, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 114 days.

(21) Appl. No.: 15/971,289

(22) Filed: May 4, 2018

(65) Prior Publication Data

US 2018/0337364 A1 Nov. 22, 2018

(30) Foreign Application Priority Data

May 19, 2017 (KR) .......................... 10-2017-0062446

(51) Int. Cl.
*H01L 51/56* (2006.01)
*G09G 3/3258* (2016.01)
(Continued)

(52) U.S. Cl.
CPC ....... *H01L 51/5246* (2013.01); *G09G 3/3258* (2013.01); *H01L 27/3276* (2013.01);
(Continued)

(58) Field of Classification Search
CPC ...... G09G 3/32; G09G 3/3208; G09G 3/3225; G09G 3/3258; G09G 3/36; G09G 3/3611; G09G 3/3648; G09G 3/3655; G09G 2300/0421; G09G 2300/0426; G09G 2320/041; G09G 2330/04;
(Continued)

(56) References Cited

U.S. PATENT DOCUMENTS 9,362,531 B2 6/2016 Hong
2005/0184927 A1\* 8/2005 Kwak ................. H01L 27/3276
345/45

(Continued)

FOREIGN PATENT DOCUMENTS

KR 10-2014-0016170 A 2/2014
KR 10-2015-0098284 A 8/2015

*Primary Examiner* — Nathan Danielsen
(74) *Attorney, Agent, or Firm* — Lewis Roca Rothgerber Christie LLP

(57) ABSTRACT

A display device includes a first substrate having a display area and a non-display area around the display area, a light-emitting element in the display area and including a pixel electrode, a common electrode, and an emission member between the pixel electrode and the common electrode, a common voltage transfer line in the non-display area and electrically connected to the common electrode, a second substrate opposite the first substrate, and a sealant in the non-display area between the first substrate and the second substrate, the sealant surrounding the display area, wherein the common voltage transfer line includes a first portion overlapping the sealant and a second portion positioned between the sealant and the display area, and wherein the second portion has at least one opening or cut-out portion.

17 Claims, 10 Drawing Sheets

(51) Int. Cl.
*H01L 27/32* (2006.01)
*H01L 51/52* (2006.01)

(52) U.S. Cl.
CPC ........ *H01L 51/56* (2013.01); *G02F 2201/121* (2013.01); *G02F 2201/123* (2013.01)

(58) Field of Classification Search
CPC .......... G09G 2330/045; H01L 27/3244; H01L 27/3276; H01L 27/3297; H01L 51/524–525; H01L 51/56; G02F 1/1343; G02F 1/13439; G02F 2001/134318; G02F 2201/121–123
See application file for complete search history.

(56) References Cited

U.S. PATENT DOCUMENTS

| | | | |
|---|---|---|---|
| 2005/0280360 A1* | 12/2005 | Park | H01L 27/3223 313/504 |
| 2006/0139556 A1* | 6/2006 | Ahn | G02F 1/13394 349/153 |
| 2012/0001187 A1* | 1/2012 | Yamazaki | H01L 27/3272 257/59 |
| 2012/0091479 A1* | 4/2012 | Hara | G02F 1/1345 257/88 |
| 2012/0168779 A1* | 7/2012 | Lee | H01L 27/3276 257/88 |
| 2014/0071355 A1* | 3/2014 | Im | G02F 1/13338 349/12 |
| 2015/0102299 A1* | 4/2015 | Hong | H01L 27/3258 257/40 |
| 2016/0293883 A1 | 10/2016 | Hong et al. | |
| 2017/0084865 A1* | 3/2017 | Chao | H01L 51/5237 |
| 2017/0110048 A1 | 4/2017 | Kim et al. | |

\* cited by examiner

DISPLAY DEVICE

CROSS-REFERENCE TO RELATED APPLICATION

This application claims priority to and the benefit of Korean Patent Application No. 10-2017-0062446, filed in the Korean Intellectual Property Office on May 19, 2017, the entire content of which is incorporated herein by reference.

BACKGROUND

1. Field

Aspects of this disclosure relate to a display device, and more particularly, to an organic light emitting diode display.

2. Description of the Related Art

An organic light emitting diode display includes pixels implemented by organic light emitting diodes each including two electrodes and an organic emission layer disposed therebetween. Electrons injected from a cathode that is one electrode of the organic light emitting diode and holes injected from an anode that is another electrode are bonded to each other in the organic emission layer to form excitons, and light is emitted while the excitons discharge energy. The organic light emitting diode display may display an image by controlling luminance, which is a degree of emission of each organic light emitting diode.

Elements, particularly an organic emission layer and electrodes constituting the organic light emitting diode display, are vulnerable to moisture, oxygen and the like, and thus it is important to seal off moisture, oxygen, and/or the like from the outside. A technique has been used in which an encapsulation substrate and an element substrate where organic light emitting diodes are formed are bonded together by a fused and hardened frit (sealant) by disposing the frit therebetween and radiating a laser beam to the frit, as a sealing method with high airtightness.

Recently, there has been an increasing demand for reducing a width of the bezel, which reduces a distance between a display area and a sealant, and causes heat generated by a sealing process to affect other elements of the display.

The above information disclosed in this Background section is only for enhancement of understanding of the background of the invention and therefore it may contain information that does not form prior art.

SUMMARY

Aspects of embodiments of the present invention are directed to a display device capable of reducing or preventing damage caused by heat generated in a sealing process.

According to some exemplary embodiments of the present invention there is provided a display device including: a first substrate having a display area and a non-display area around the display area; a light-emitting element in the display area and including a pixel electrode, a common electrode, and an emission member between the pixel electrode and the common electrode; a common voltage transfer line in the non-display area and electrically connected to the common electrode; a second substrate opposite the first substrate; and a sealant in the non-display area between the first substrate and the second substrate, the sealant surrounding the display area, wherein the common voltage transfer line includes a first portion overlapping the sealant and a second portion positioned between the sealant and the display area, and wherein the second portion has at least one opening or cut-out portion.

In some embodiments, the first substrate includes a first end portion and a second end portion at opposite sides of the substrate with the display area therebetween, the display device further includes a pad portion at the first end portion, and the at least one opening or the cut-out portion is at a corner portion of the first substrate corresponding to opposite end portions of the second end portion.

In some embodiments, the at least one opening has a slit shape that extends through the common voltage transfer line in a thickness direction thereof.

In some embodiments, the at least one opening has a curved planar shape.

In some embodiments, the common voltage transfer line includes a portion that is curvedly formed in a plan view at the corner portion.

In some embodiments, the display device further includes: a connecting member connected with the common voltage transfer line and the common electrode.

In some embodiments, the connecting member is at a same layer as that of the pixel electrode, and the display device further includes a planarization layer on the first substrate and below the connecting member and the pixel electrode.

In some embodiments, the planarization layer does not overlap the common voltage transfer line at the second end portion.

In some embodiments, the display device further includes: a pixel definition layer on the common electrode and below the connecting member and the pixel electrode.

In some embodiments, the connecting member is not connected with the common voltage transfer line at the corner portion.

In some embodiments, the display device further includes: a touch electrode and a touch signal line on the second substrate, wherein the touch signal line overlaps the connecting member.

In some embodiments, a surface of the sealant facing an outside of the display device protrudes from edges of the first substrate and the second substrate.

In some embodiments, the first portion of the common voltage transfer line has at least one opening.

In some embodiments, the display device further includes: a transistor in the display area and connected with the pixel electrode of the light-emitting element, wherein the common voltage transfer line is at a same layer as that of a source electrode and a drain electrode of the transistor.

In some embodiments, the display device further includes: a transistor in the display area and connected with the pixel electrode of the light-emitting element, wherein the common voltage transfer line is disposed at a same layer as that of a gate electrode of the transistor.

According to some exemplary embodiments of the present invention there is provided a display device including: a first substrate including a display area and a non-display area around the display area, the non-display area including a first end portion and a second end portion at opposite sides of the substrate with the display area therebetween; a light-emitting element in the display area and including a pixel electrode, a common electrode, and an emission member between the pixel electrode and the common electrode; a common voltage transfer line in the non-display area and electrically connected to the common electrode; a connecting member in the non-display area and connected with the common electrode and the common voltage transfer line; a pad portion at the first end portion; a second substrate facing the first substrate; and a sealant in the non-display area between the first substrate and the second substrate, the sealant surrounding the display area, wherein the connecting member is electrically disconnected from the common voltage transfer line at a corner portion of the first substrate corresponding to opposite end portions of the second end portion.

In some embodiments, the connecting member is separated from the common voltage transfer line in a plan view at the corner portion.

In some embodiments, the connecting member is at a same layer as that of the pixel electrode, and the display device further includes a planarization layer on the first substrate and below the connecting member and the pixel electrode.

In some embodiments, the planarization layer does not overlap the common voltage transfer line at the second end portion.

In some embodiments, the display device further includes: a pixel definition layer on the common electrode and below the connecting member and the pixel electrode.

According to the exemplary embodiments, the heat generated in the sealing process is suppressed or substantially prevented from being conducted to the organic insulating layer, so that shrinkage of the pixel due to outgasing of the organic insulating layer can be reduced or prevented.

DETAILED DESCRIPTION

Figure 1:
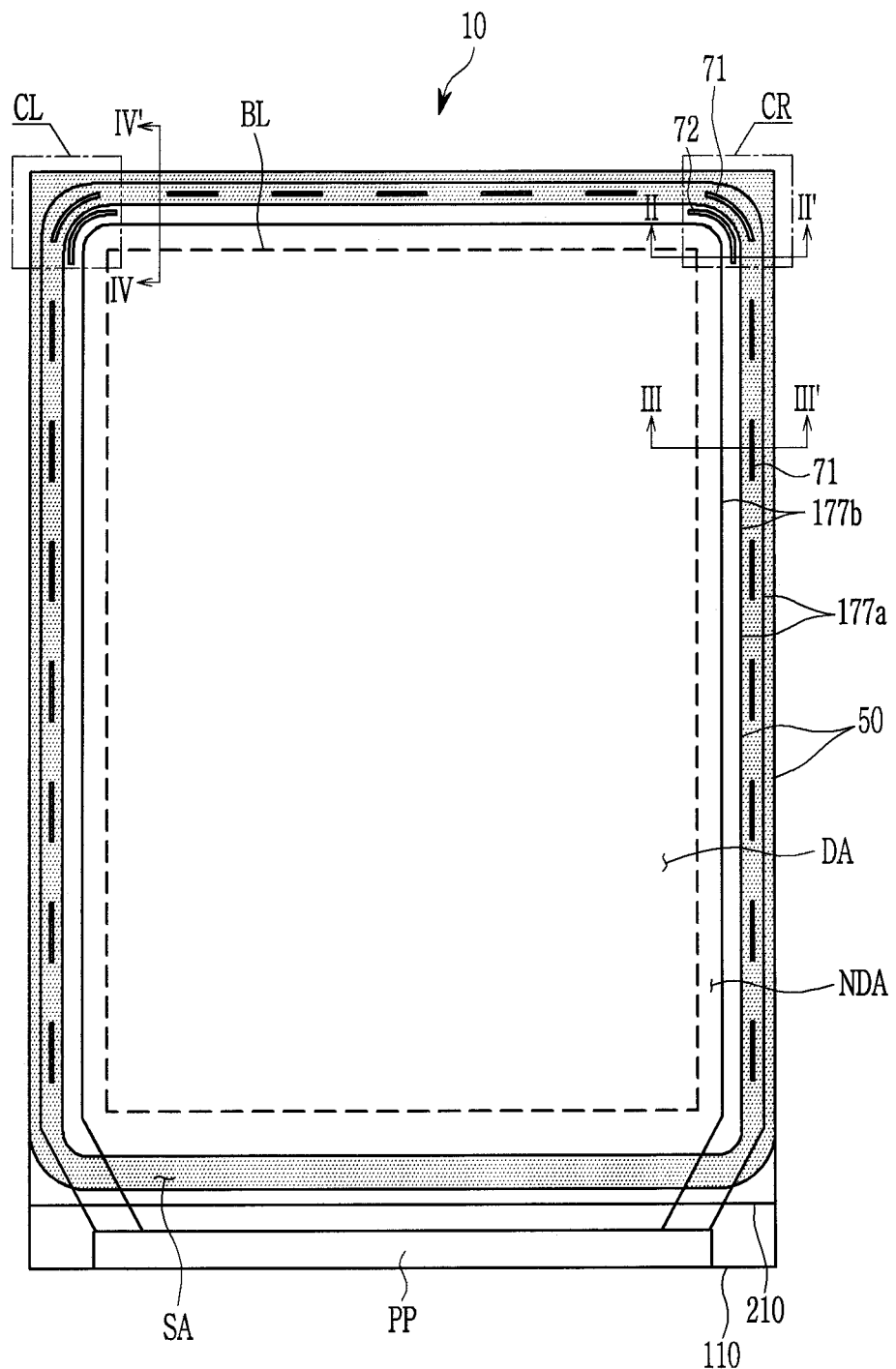
FIG. 1 is a layout view schematically illustrating a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various suitable ways, all without departing from the spirit or scope of the present invention.

To clearly describe the present invention, parts that are not critical to the description may be omitted. Herein, like numerals refer to like or similar constituent elements throughout the specification.

Further, because sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., may be exaggerated for clarity.

Next, a display device according to an exemplary embodiment of the present invention will be described with reference to accompanying drawings. Although an organic light emitting diode display is described as an example, the display device according to the present invention is not limited thereto.

Figure 2:
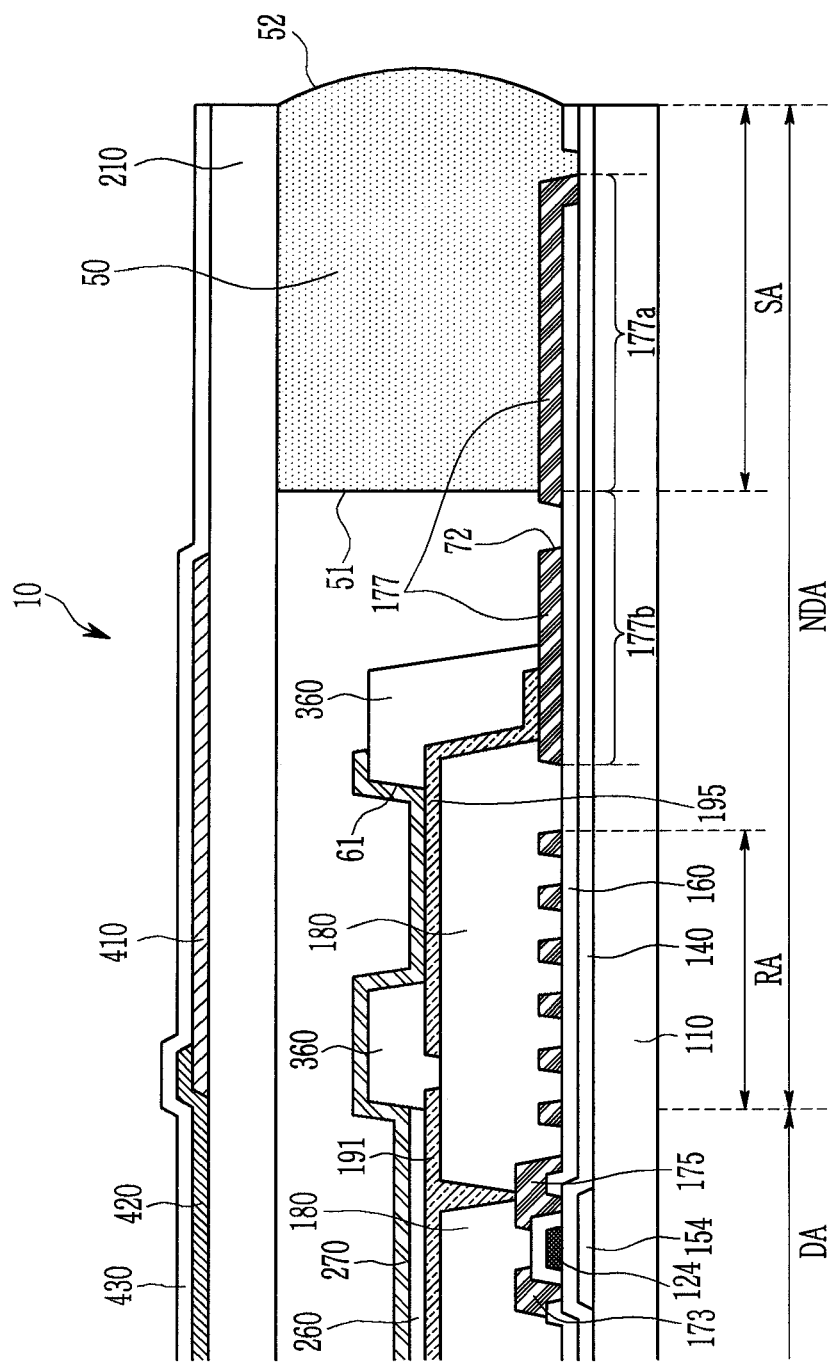
FIG. 2 is a cross-sectional view illustrating an example of a cross-section taken along the line II-II' in FIG. 1.
Figure 3:
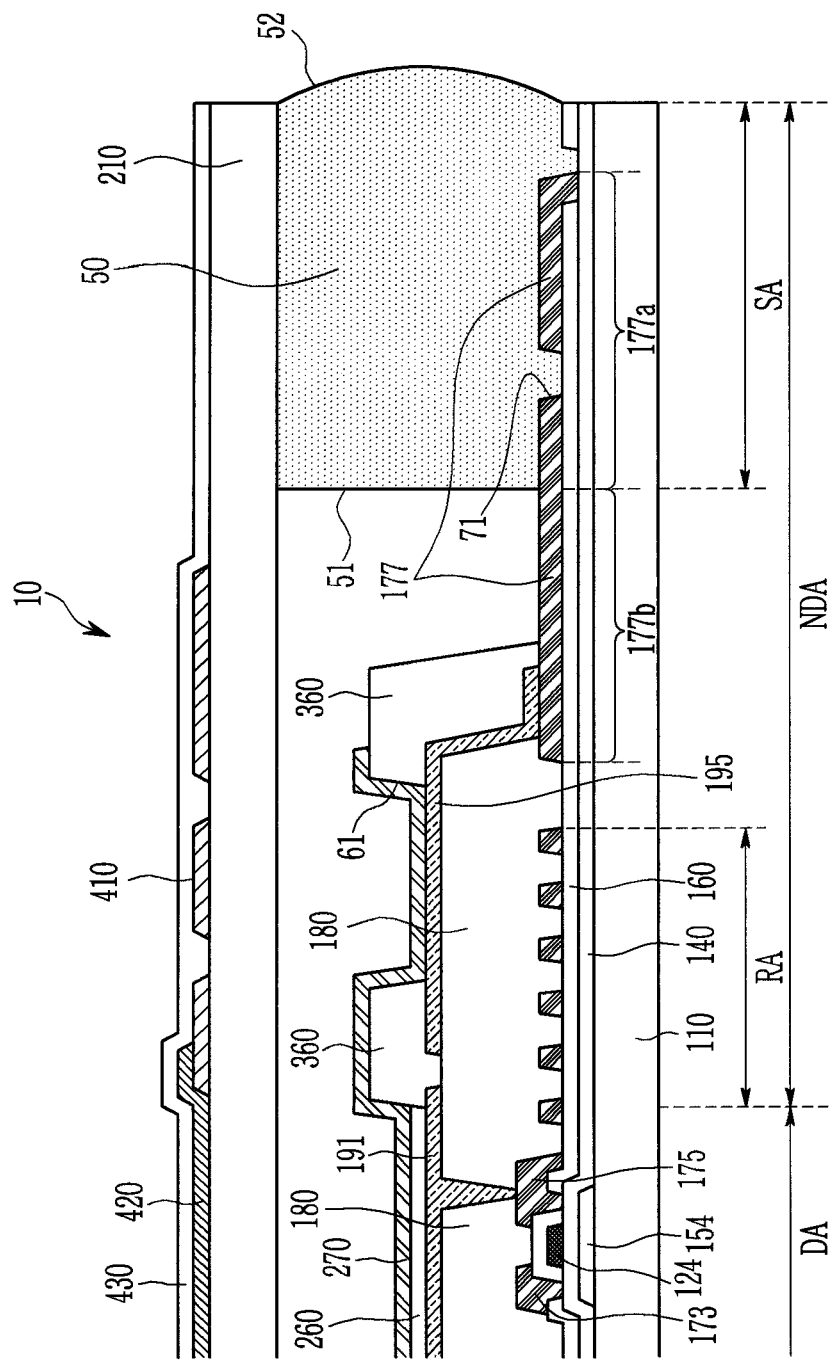
FIG. 3 is a cross-sectional view illustrating an example of a cross-section taken along the line III-III' in FIG. 1.
Figure 4:
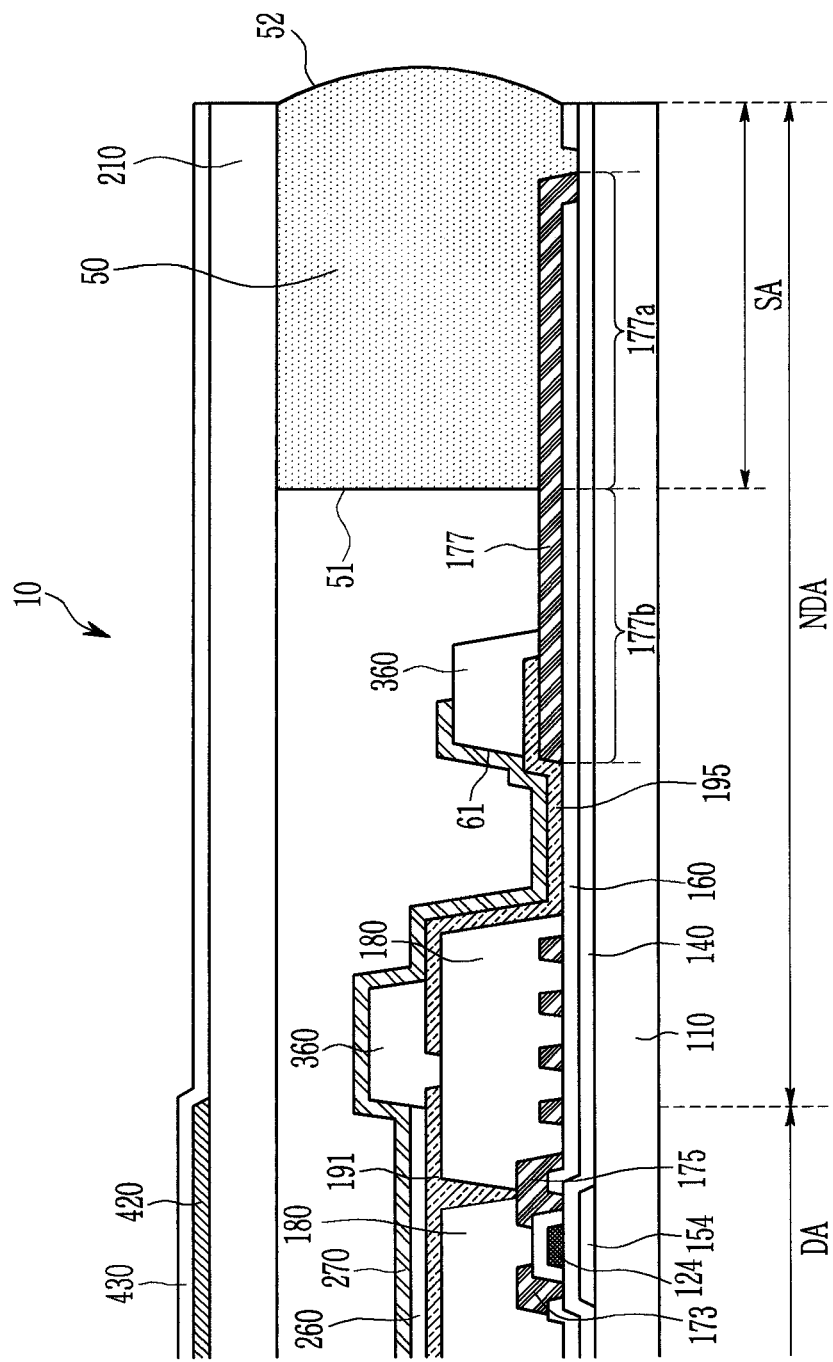
FIG. 4 is a cross-sectional view illustrating an example of a cross-section taken along the line IV-IV' in FIG. 1.

FIG. 1 is a layout view schematically illustrating a display device according to an exemplary embodiment of the present invention. FIG. 2 is a cross-sectional view illustrating an example of a cross-section taken along the line II-II' in FIG. 1. FIG. 3 is a cross-sectional view illustrating an example of a cross-section taken along the line III-III' in FIG. 1. FIG. 4 is a cross-sectional view illustrating an example of a cross-section taken along the line IV-IV' in FIG. 1.

Referring to FIG. 1 to FIG. 4, the display device 10 includes a display area DA (also referred to as an active area) for displaying the images, and a non-display area NA (also referred to as a peripheral area) positioned at an outer periphery (e.g., an outer perimeter) of the display area DA, in which elements and/or wires for generating and/or transferring various signals that are applied to the display area DA are disposed. In the drawing, an inner area of a quadrangular boundary line BL illustrated by a dotted line corresponds to the display area DA, and an outer area corresponds to the non-display area NDA. In the non-display area NDA, a lower region of the display area DA is referred to as a lower end portion (e.g., a first end portion) of the display device 10, and an upper region of the display area DA is referred to as an upper end portion (e.g., a second end portion) of the display device 10.

In the display area DA, pixels are disposed on the first substrate 110 in a matrix form. In the display area DA, signal lines such as gate lines and data lines are disposed on the first substrate 110. The gate lines may extend mainly in a first direction (e.g., in a row direction), and the data lines may extend mainly in a second direction (e.g., in a column direction) that crosses the first direction. A gate line and a data line are connected to each pixel to receive a gate signal and a data signal from the signal lines. In the organic light emitting diode display, driving voltage lines for transferring driving voltages to the pixels may be disposed on the first substrate 110 to extend in the second direction in the display area DA.

A touch electrode 420 for sensing a contact or non-contact touch of a user may be disposed in the display area DA. For example, the touch electrode 420 may be disposed on a second substrate 210; however, the present invention is not limited thereto.

In the non-display area NDA, a pad portion PP including pads for receiving signals from outside of the display device 10 is disposed on a first substrate 110. As illustrated therein, the pad portion PP may be disposed in the lower end portion, which is the first end portion of the display device 10. The pads of the pad portion PP are connected with wires disposed in the non-display area NDA. A flexible printed circuit film for transferring voltages and signals from the outside may be bonded to the pad portion PP. Three edges (e.g., upper, left, and right edges) of the first substrate 110 may coincide with three sides of the second substrate 210 in a plan view. However, the first substrate 110 is longer than the second substrate 210 in a region (e.g., the first end portion) where the pad portion PP is disposed such that the pad portion PP can be exposed to the outside for the bonding of the flexible printed circuit film.

The driving device, which generates and/or processes various suitable signals for driving the pixels of the display area DA, may be disposed in the non-display area NDA, and may be disposed in the flexible printed circuit film bonded to the pad portion PP. The driving device may include a data driver which applies a data signal to the data line, a gate driver which applies a gate signal to the gate line, and a signal controller which controls the gate driver and the data driver. The gate driver may be integrated in the non-display area NDA positioned at a left side and/or a right side of the display area DA.

A common voltage transfer line 177 for supplying a common voltage to the pixels is disposed in the non-display area NDA. The common voltage transfer line 177 may be supplied with a common voltage of a set or predetermined level and apply it to a common electrode 270 of the pixels through the pad portion PP. The common voltage transfer line 177 has a first end and a second end electrically connected to the pad portion PP, and is formed to surround the display area DA. Unlike the illustrated exemplary embodiment, the common voltage transfer line 177 may be formed only at the left side and/or the right side of the display area DA, for example. A touch signal line 410 for transferring a signal and/or from the touch electrode 420 may also be disposed in the non-display area NDA.

The non-display area NDA includes a sealing area SA. The sealing area SA is separated from the display area DA, and is disposed at an upper side and left and right sides of the second substrate 210. However, the sealing area SA may be disposed slightly away from a lower edge of the second substrate 210. This is because when the sealing area SA reaches to the lower side, it may be difficult to cut the second substrate 210 shorter than the first substrate 110. In the sealing area SA, a sealant 50 is disposed between the first substrate 110 and the second substrate 210, which is an encapsulation substrate. The sealant 50 is formed to completely surround the display area DA, and is formed to overlap the sealing area SA in a plan view. The sealant 50 serves to adhere the first substrate 110 and the second substrate 210 to reduce or prevent impurities, such as moisture and oxygen, from penetrating between the first substrate 110 and the second substrate 210 from the outside. Accordingly, the display area DA may be air-tightly sealed by the first substrate 110, the second substrate 210, and the sealant 50 therebetween.

The sealant 50 includes an inner surface 51 facing (e.g., spaced apart and opposite from) the display area DA and an outer surface 52 facing the outside of display device 10. When the display device 10 has a quadrangular shape, the inner surface of the sealant 50 may have a substantially quadrangular shape in a plan view. In this case, four corners of the sealant 50 may be curved. The outer surface of the sealant 50 may coincide with edges of the first substrate 110 and the second substrate 210. However, as shown in FIG. 2, the outer surface of the sealant 50 may be formed to be convex, that is, to protrude past the edges of the first substrate 110 and the second substrate 210. In the latter case, a risk of damage to the edges of the first substrate 110 and the second substrate 210 caused by an impact and/or the like can be reduced.

For example, the sealant 50 may be formed by coating a sealing material on the second substrate 210, positioning the first substrate 110 such that the sealing material is disposed between the first substrate 110 and the second substrate 210, and radiating laser light to the portion on which the sealant is coated. For another example, the sealant 50 may be formed by coating the sealing material on the first substrate 110, positioning the second substrate 210, and radiating the laser light to the portion on which the sealant is coated. The coated sealing material may be a frit, for example, a glass frit. When the sealing material is heated by radiating the laser light thereto, the sealing material is melted and adhered to the first substrate 110 and the second substrate 210 like an adhesive. Then, it is cured in the adhered state to form the sealant 50, which air-tightly adheres the first substrate 110 and the second substrate 210. For example, the laser light may be radiated onto the second substrate 210 toward the sealing material.

Heat applied by the laser to the sealing material may be, for example, at least 300° C., and may be conducted to layers disposed close to the display area DA by a thermal conductor, such as a metal, a metal alloy, or the like. As a distance between the display area DA and the sealing area SA is reduced depending on a design for reducing a bezel width, the amount of conducted heat may increase. In this case, a gas may be discharged from an organic insulating layer (e.g., a planarization layer 180, a pixel definition layer 360, and the like to be described later), and the discharged gas may cause shrinkage in which a light-emitting area is reduced by deteriorating an emission member 260. In other words, heat of the laser forming the sealant 50 may be conducted to the organic insulating layer to cause outgassing from the organic insulating layer, thereby causing a shrinkage defect.

The common voltage transfer line 177 may have a first portion 177a that overlaps the sealant 50 and a second portion 177b that does not overlap the sealant 50. A slit-shaped opening 71 may be formed in the first portion 177a of the common voltage transfer line 177 to increase the contact area of the lower end portion of the sealant 50 to increase an adhesion force. The opening 71 may be formed in a set or predetermined width, length, and interval, and may be regularly or irregularly formed. The opening 71 may be formed in a substantially straight line in a plan view, but is not limited thereto. For example, upper left and right corner portions CL and CR of the display device 10 may be curved. The upper left and right corner portions CL and CR of the display device 10 correspond to opposite end portions of the upper end portion of the second end portion of the display device 10. A planar shape of the display device 10 corresponds to a planar shape of the first substrate 110, and thus the upper left and right corner portions CL and CR of the display device 10 correspond to the upper left and right corner portions CL and CR of the first substrate 110. In the upper left and right corner portions CL and CR, the common voltage transfer line 177 may be formed to extend in a curved line. The first portion 177a of the common voltage transfer line 177 may serve as a reflective layer for enhancing utilization efficiency of the laser light irradiated when the sealant 50 is formed.

The second portion 177b of the common voltage transfer line 177 is disposed between the display area DA and the sealing area SA. The second portion 177b of the common voltage transfer line 177 is not covered with the sealant 50, and is connected with a connecting member 195 connected with the common electrode 270 of the pixel. Referring to FIG. 3 and FIG. 4, the common electrode 270 is electrically connected to the common voltage transfer line 177 through the connecting member 195. Referring to FIG. 2, an opening 72 is formed at the second portion 177b of the common voltage transfer line 177 in the upper left corner portion CL and the upper right corner portion CR of the display device 10. The opening 72 may have a slit-like form, or may have any form that can physically disconnect the second portion 177b of the common voltage transfer line 177 based on the opening 72. Accordingly, the opening 72 is formed to extend through the second portion 177b of the common voltage transfer line 177 in a thickness direction. The opening 72 may be formed in a planar curve similar to the inner surface 51 of the sealant 50 disposed at the upper left and right corner portions CL and CR of the display device 10; however, the present invention is not limited thereto.

When the laser light is radiated to the sealing material, a course (e.g., the movement direction) of the laser is changed at the corner portions CL and CR of the display device 10, and thus a laser irradiation time is relatively long. A laser irradiation device may radiate laser light while linearly moving in one direction in a region other than the corner portions, for example, between the left corner portion CL and the right corner portion CR. However, the laser irradiation device may radiate the laser light while moving alternately in two directions like a step at the corner portions CL and CR. Accordingly, because a time during which the laser light is applied to the corner portions CL and CR of the display device 10 is increased, the heat applied to the sealing material is also greater than the heat applied to the sealing material positioned in the other region. The heat applied to the sealant 50 can be conducted to the display area DA through the common voltage transfer line 177. More heat is applied to the sealant 50 positioned at the corner portions CL and CR so that more heat can be conducted at the corner portions CL and CR. However, the opening 72 is formed in the second portion 177b of the common voltage transfer line 177 at the corner portions CL and CR, and thus it is possible to prevent or substantially prevent the heat applied to form the sealant 50 from being directly conducted to the display area DA.

In the illustrated exemplary embodiment, no opening is formed in left and right corner portions and portions adjacent thereto at the second portion 177b of the common voltage transfer line 177, at a lower side of the display device 10 where the pad portion PP is disposed. Unlike the upper side of the display device 10, a region for forming various suitable circuits such as a data fan-out portion, wires including a power supply voltage transfer line, and a multiplexer is utilized between the display area DA and the sealing area SA at the lower side of the display device 10. Accordingly, an amount of heat conducted to the display area DA may be reduced. However, an opening may also be formed in the second portion 177b of the common voltage transfer line 177 adjacent to the lower left and right corners of the display device 10 according to the design of the display device.

The stacked structure of the display device 10 will be described in more detail. The first substrate 110 is an insulating substrate made of glass, quartz, ceramics, and/or the like, and may be optically transparent.

A semiconductor layer 154 of a transistor is disposed on the first substrate 110. The semiconductor layer 154 includes a channel region, and a source region and a drain region disposed at opposite sides of the channel region. The semiconductor layer 154 may include polysilicon, amorphous silicon, an oxide semiconductor, and/or the like.

A light-blocking electrode may be disposed between the first substrate 110 and the semiconductor layer 154. The light-blocking electrode may prevent or substantially prevent external light from reaching the semiconductor layer 154, thereby preventing or substantially preventing a characteristic of the semiconductor layer 154 from deteriorating and reducing or minimizing the leakage current of the transistor. A buffer layer may be disposed between the first substrate 110 and the semiconductor layer 154 to reduce or prevent impurities that deteriorate the characteristic of the semiconductor layer 154 from diffusing and to reduce or prevent penetration of moisture and/or the like.

A gate insulating layer 140 is disposed on the semiconductor layer 154. The gate insulating layer 140 may include an inorganic insulating material such as silicon oxide (SiOx), silicon nitride (SiNx), and/or the like.

A gate conductor including a gate electrode 124 of a transistor, a gate line, and the like is disposed on the gate insulating layer 140. The gate electrode 124 may overlap the channel region of the semiconductor layer 154. The gate conductor may include a metal such as molybdenum (Mo), copper (Cu), aluminum (Al), silver (Ag), chromium (Cr), tantalum (Ta), titanium (Ti), or the like, or a metal alloy thereof, and may be formed of a single layer or may be multilayer.

An interlayer insulating layer 160 including an inorganic insulating material is disposed on the gate conductor.

A data conductor including a source electrode 173 and a drain electrode 175 of the transistor, a data line, a driving voltage line, and the common voltage transfer line 177 is disposed on the interlayer insulating layer 160. The data conductors may be formed of a same or substantially the same material in a same or substantially the same process. For example, a conductive layer may be formed on the interlayer insulating layer 160, and is patterned through a photolithography process to form the source electrode 173, the drain electrode 175, the common voltage transfer line 177, the data line, the driving voltage line, and the like. The source electrode 173 and the drain electrode 175 may be connected to the source region and the drain region of the semiconductor layer 154 through contact holes (or contact openings) formed in the interlayer insulating layer 160. In the upper left and right corner portions CL and CR of the display device 10, an opening 72 may be formed in the second portion 177b of the common voltage transfer line 177, to block a heat conduction path. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof, and may be formed of a single layer or may be multilayer (e.g., Ti/Al/Ti, Mo/Al/Mo, Mo/Cu/Mo, and the like). In the illustrated exemplary embodiment, the common voltage transfer line 177 is formed of a data conductor; however, the present invention is not limited thereto. For example, the common voltage transfer line 177 may be formed of a gate conductor.

The gate electrode 124, the source electrode 173, and the drain electrode 175 constitute a transistor together with the semiconductor layer 154. The transistor illustrated therein may be a driving transistor in a pixel of the organic light emitting diode display. The illustrated transistor may be referred to as a top-gate transistor in which the gate electrode 124 is disposed above the semiconductor layer 154. A structure of the transistor is not limited thereto, and may be variously modified in a suitable manner. For example, the illustrated transistor may be a bottom-gate transistor in which the gate electrode is disposed below the semiconductor layer, and may be a vertical transistor in which the gate electrode is disposed in a side surface of the semiconductor layer.

The planarization layer 180 is disposed on the interlayer insulating layer 160 and the first data conductor. The planarization layer 180 serves to remove and planarize a step in order to increase emission efficiency of the organic light emitting element to be formed thereon. The planarization layer 180 may include an organic insulating material. The organic insulating material may include polyimide, polyamide, polyacrylate, polyphenylene ether, polyphenylene sulfide, unsaturated polyester, an epoxy resin, phenol resin, and/or the like; however, it is not limited thereto. For example, elements (transistors, capacitors, and the like) constituting a driver such as a gate driver may be formed between the first substrate 110 and the planarization layer 180, in a driver region RA adjacent to the display area DA.

Heat applied when the sealant 50 is formed may be prevented or substantially prevent from being conducted to the interlayer insulating layer 160 by the opening 72 formed in the second portion 177b of the common voltage transfer line 177, at the upper left and right corner portions CL and CR of the display device 10. Accordingly, outgassing of the interlayer insulating layer 160 is reduced or prevented to reduce or prevent a shrinkage defect.

Referring to FIG. 4, the planarization layer 180 may be removed from the non-display area NDA adjacent to the sealant 50 at an upper side of the display device 10. When laser light is radiated to form the sealant 50, the heat may be applied or transferred to the planarization layer 180. In this case, a gas may be discharged from the planarization layer 180. The discharged gas may degenerate the emission member 260 to cause the shrinkage. The outgassing of the planarization layer 180 may be reduced or prevented by removing the planarization layer 180 in an area where the planarization layer 180 can be removed, to reduce or prevent occurrence of the shrinkage. The area where the planarization layer 180 is removed may be an area between the upper left corner portion CL and the upper right corner portion CR of the display device 10, and may include the upper left corner portion CL and the upper right corner portion CR. When a data conductor is disposed below the planarization layer 180, the data conductor may be covered by the planarization layer 180 and the like, and thus the planarization layer 180 may be removed in a region that does not overlap the data conductor. However, although the common voltage transfer line 177 is a data conductor, the planarization layer 180 may be removed in a region that overlaps the common voltage transfer line 177.

A pixel electrode 191 and the connecting member 195 are disposed on the planarization layer 180. The pixel electrode 191 and the connecting member 195 may be formed of a same or substantially the same material in a same or substantially the same process. For example, the pixel electrode 191 and the connecting member 195 may be formed by forming a conductive layer in the planarization layer 180 and patterning it through a photolithography process. The pixel electrode 191 is connected with the drain electrode 175 of a transistor through a contact hole (or a contact opening) formed in the planarization layer 180. Unlike what is illustrated, the pixel electrode 191 may be connected to the source electrode 173 of the transistor. The connecting member 195 is connected with the common voltage transfer line 177, which is not covered by the planarization layer 180. The pixel electrode 191 and the connecting member 195 may be formed of a reflective conductive material or a semi-transmittance conductive material, or may be formed of a transparent conductive material. For example, the pixel electrode 191 and the connecting member 195 may include a transparent conductive material such as indium tin oxide (ITO), indium zinc oxide (IZO), and/or the like, or a metal including lithium (Li), calcium (Ca), aluminum (Al), silver (Ag), magnesium (Mg), gold (Au), and/or the like.

The pixel definition layer 360 is disposed on the planarization layer 180, the pixel electrode 191, and the connecting member 195

The pixel definition layer 360 includes an opening overlapping the pixel electrode 191. The opening of the pixel definition layer 360 may define an area corresponding to the pixel. The pixel definition layer 360 may include an organic insulating material such as polyimide, polyacrylate, polyamide, and/or the like.

Heat applied when the sealant 50 is formed may be prevented or substantially prevented from being conducted to the interlayer pixel definition layer 360 by the opening 72 formed in the second portion 177b of the common voltage transfer line 177, at the upper left and right corner portions CL and CR of the display device 10

Accordingly, outgassing of the pixel definition layer 360 is reduced or prevented to reduce or prevent a shrinkage defect. Similar to the planarization layer 180, the pixel definition layer 360 may be removed from the non-display area NDA adjacent to the sealant 50 at an upper side of the display device 10 in order to reduce or prevent the shrinkage caused by the outgassing. For example, in FIG. 4, a portion of the pixel definition layer 360, which overlaps the common voltage transfer line 177 and the connecting member 195 may be removed.

The emission member 260 is disposed on the pixel electrode 191. The emission member 260 may include a first organic common layer, an emission layer, and a second organic common layer, which are stacked in sequence. The first organic common layer may include at least one of a hole-injection layer and a hole-transporting layer. The emission layer may be made of an organic material, which uniquely emits light of one of primary colors such as red, green, and blue, and may have a structure in which a plurality of organic material layers emitting light of different colors are stacked. The second organic common layer may include at least one of an electron-transporting layer and an electron-injection layer.

The common electrode 270 for transferring a common voltage is disposed on the emission member 260. The common electrode 270 may include a transparent conductive material such as an indium tin oxide (ITO), an indium zinc oxide (IZO), and/or the like. The common electrode 270 may be formed by thinly stacking a metal including calcium (Ca), barium (Ba), magnesium (Mg), aluminum (Al), silver (Ag), and/or the like to have light permeability. The common electrode 270 is connected with the connecting member 195 through a contact hole (or a contact opening) 61 formed in the pixel definition layer 360. Because the connecting member 195 is connected with the common voltage transfer line 177, the common electrode 270 may be electrically connected to the common voltage transfer line 177 through the connecting member 195, and may receive a common voltage from the common voltage transfer line 177. Referring to FIG. 2, the opening 72 is formed in the second portion 177b, which does not overlap the sealant 50 of the common voltage transfer line 177 in a region that is adjacent to the upper corner portions CL and CR. The heat applied to the sealant 50 may be prevented or substantially prevent from being conducted to the display area DA by the opening 72. Referring to FIG. 3 and FIG. 4, no opening is formed in the second portion 177b, which does not overlap the sealant 50 of the common voltage transfer line 177, in a region that is not adjacent to the upper corner portions CL and CR. Thus, because the heat applied to the sealant 50 is less than that at the upper corner portions CL and CR, the heat that may be conducted to the display area DA is also less.

In the illustrated exemplary embodiment, the display device may not include the connecting member 195, and the common electrode 270 may be directly connected to the common voltage transfer line 177. At least one passivation layer or functional layer may be disposed on the common electrode 270.

The pixel electrode 191, the emission member 260, and the common electrode 270 of each pixel constitute a light-emitting element, which is an organic light emitting diode. Herein, the pixel electrode 191 may be an anode that is a hole injection electrode, and the common electrode 270 may be a cathode that is an electron injection electrode. Conversely, in some examples, the pixel electrode 191 may be a cathode, and the common electrode 270 may be an anode. Holes and electrons are injected from the pixel electrode 191 and the common electrode 270 into the emission member 260, and light is emitted when excitons formed by the injected holes and electrons in the emission layer fall from an excited state to a ground state.

The second substrate 210, which faces the first substrate 110, may be an insulating substrate made of glass, quartz, ceramics, and/or the like, and may be optically transparent. The second substrate 210 is bonded to the first substrate 110 by the sealant 50.

The touch signal line 410 and the touch electrode 420 are disposed on the second substrate 210. The touch signal line 410 may be positioned in the non-display area NDA, and the touch electrode 420 may be positioned in the display area DA; however, the present invention is not limited thereto. The touch signal line 410 may be formed of a metal, a metal alloy, and/or the like, and the touch electrode 420 may be formed of a transparent conductive material, a metal mesh, a conductive polymer, and/or the like. A protective layer 430 such as an insulating layer may be disposed on the touch signal line 410 and the touch electrode 420.

The touch signal line 410 may be positioned between the display area DA and the sealing area SA. This is done so that, when the touch signal line 410 is positioned up to (e.g., close to) the sealing area SA, laser light for forming the sealant 50 may be prevented or substantially prevented from being absorbed or reflected by the touch signal line 410 and be radiated to the sealing material more effectively. However, the touch signal line 410 may overlap the common voltage transfer line 177, the connecting member 195, the common electrode 270, and the pixel definition layer 360, to prevent or substantially prevent laser light from being directly applied to them or to reduce or minimize application of the laser light, in a region that does not overlap the sealing area SA. Accordingly, the touch signal line 410 may prevent or substantially prevent the heat applied when the sealant 50 is formed from being transferred to the display area DA, thereby reducing or preventing occurrence of shrinkage. Unlike the illustrated exemplary embodiment, the touch signal line 410 may be positioned up to (e.g., close to) the sealing area SA.

The touch electrode 420 is illustrated to be at least partially disposed on the touch signal line 410. In some examples, the touch signal line 410 and the touch electrode 420 may be fully at a same layer. Unlike the illustrated exemplary embodiment, the touch signal line 410 and the touch electrode 420 may be disposed on the inner surface (i.e., the surface facing the first substrate 110) of the second substrate 210, or may be formed on a separate substrate to be adhered to the second substrate 210.

Hereinafter, some exemplary embodiments will be described with reference to FIG. 5 to FIG. 9, focusing on differences from the aforementioned exemplary embodiment. The same reference numerals are given to the same or similar constituent elements.

Figure 5:
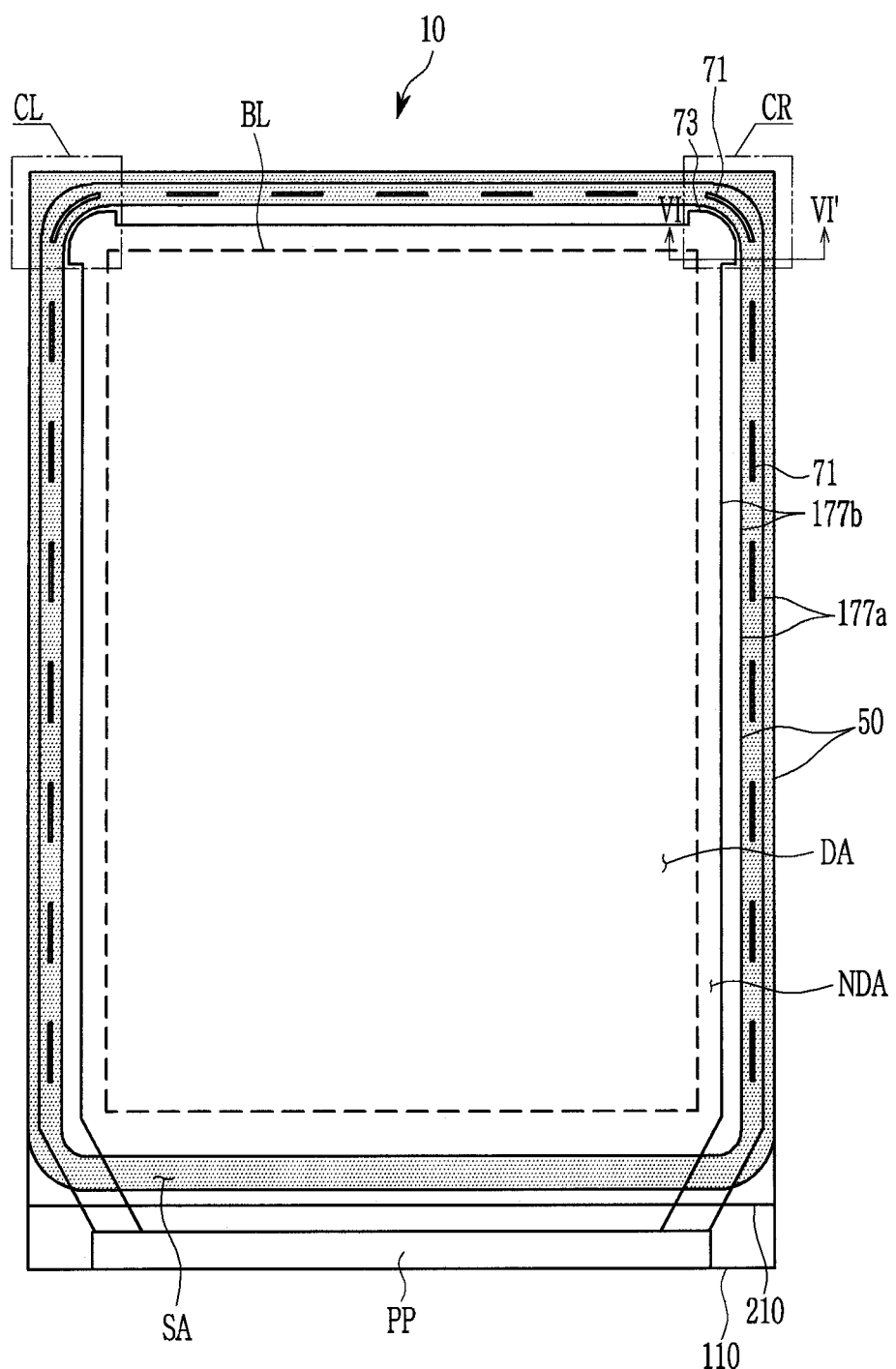
FIG. 5 is a layout view schematically illustrating a display device according to an exemplary embodiment of the present invention.
Figure 6:
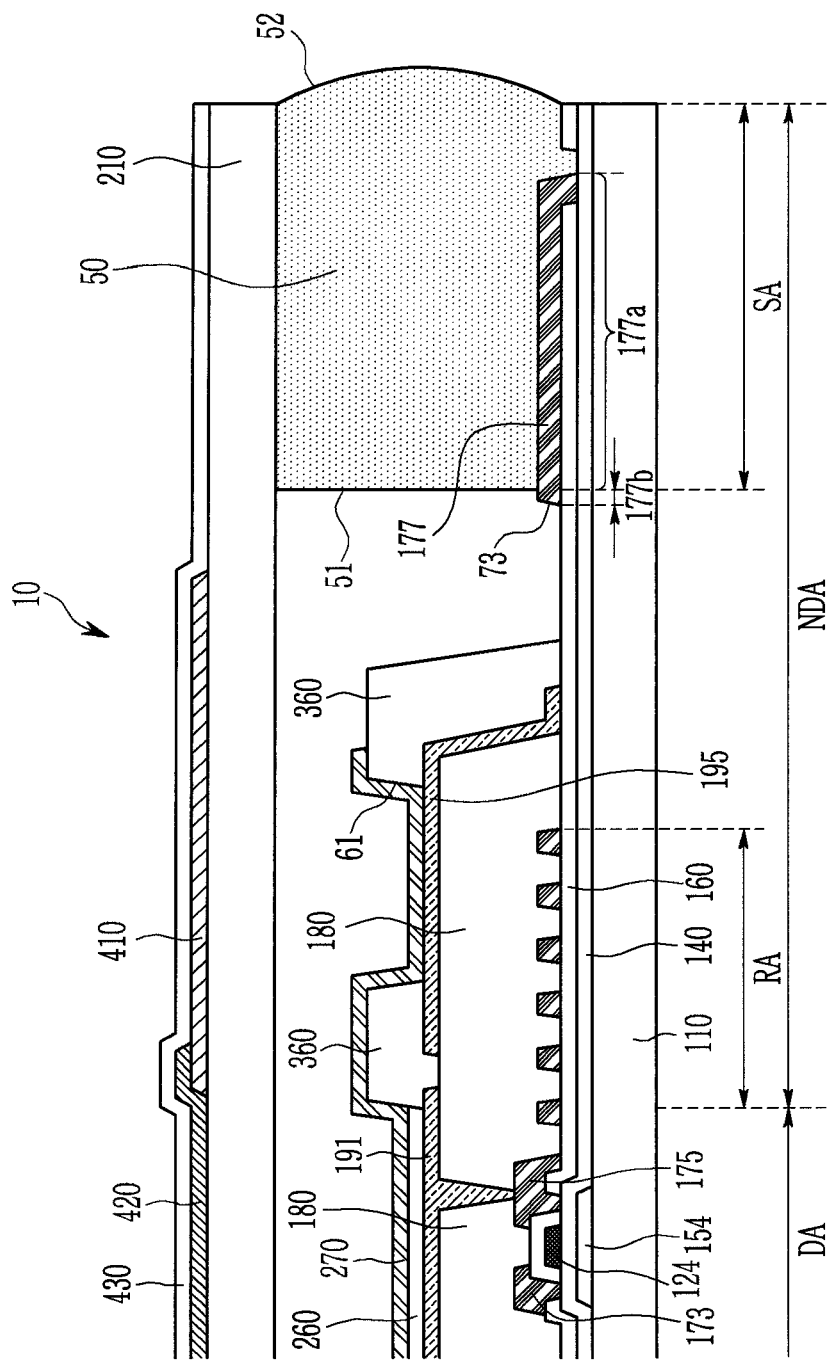
FIG. 6 is a cross-sectional view illustrating an example of a cross-section taken along the line VI-VI' in FIG. 5.

FIG. 5 is a layout view schematically illustrating a display device according to an exemplary embodiment of the present invention. FIG. 6 is a cross-sectional view illustrating an example of a cross-section taken along the line VI-VI' in FIG. 5.

Referring to FIG. 5 and FIG. 6, the second portion 177b of the common voltage transfer line 177, which does not overlap the sealant 50, is removed in the upper left and right corner portions CL and CR of the display device 10, and the connecting member 195 is not connected with the common voltage transfer line 177 in the upper left and right corner portions CL and CR. Hereinafter, a removed portion of the second portion 177b, which enters the sealant 50, will be referred to as a cut-out portion 73. The connecting member 195 is disconnected from (e.g., electrically disconnected or isolated from) the common voltage transfer line 177 by the cut-out portion 73 of the common voltage transfer line 177 at the upper left and right corner portions CL and CR, and thus a path through which the heat is transferred from the common voltage transfer line 177 to the display area DA may be blocked. Therefore, it is possible to reduce or prevent the occurrence of shrinkage caused by the heat applied when the sealant 50 is formed. For reference, in the aforementioned exemplary embodiment of FIG. 1 and FIG. 2, the slit-shaped opening 71 is formed in a corresponding portion of the common voltage transfer line 177.

Figure 7:
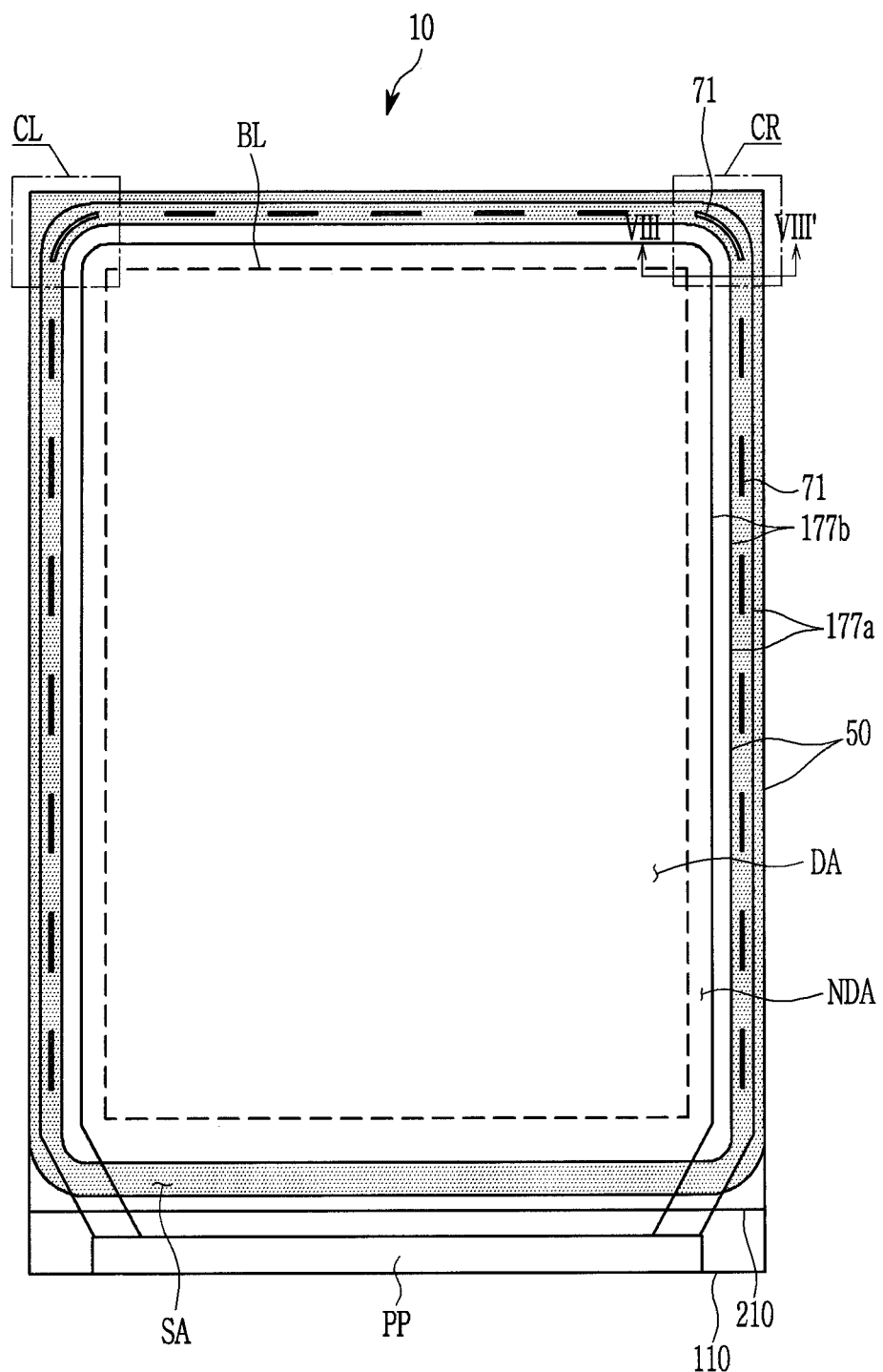
FIG. 7 is a layout view schematically illustrating a display device according to an exemplary embodiment of the present invention.
Figure 8:
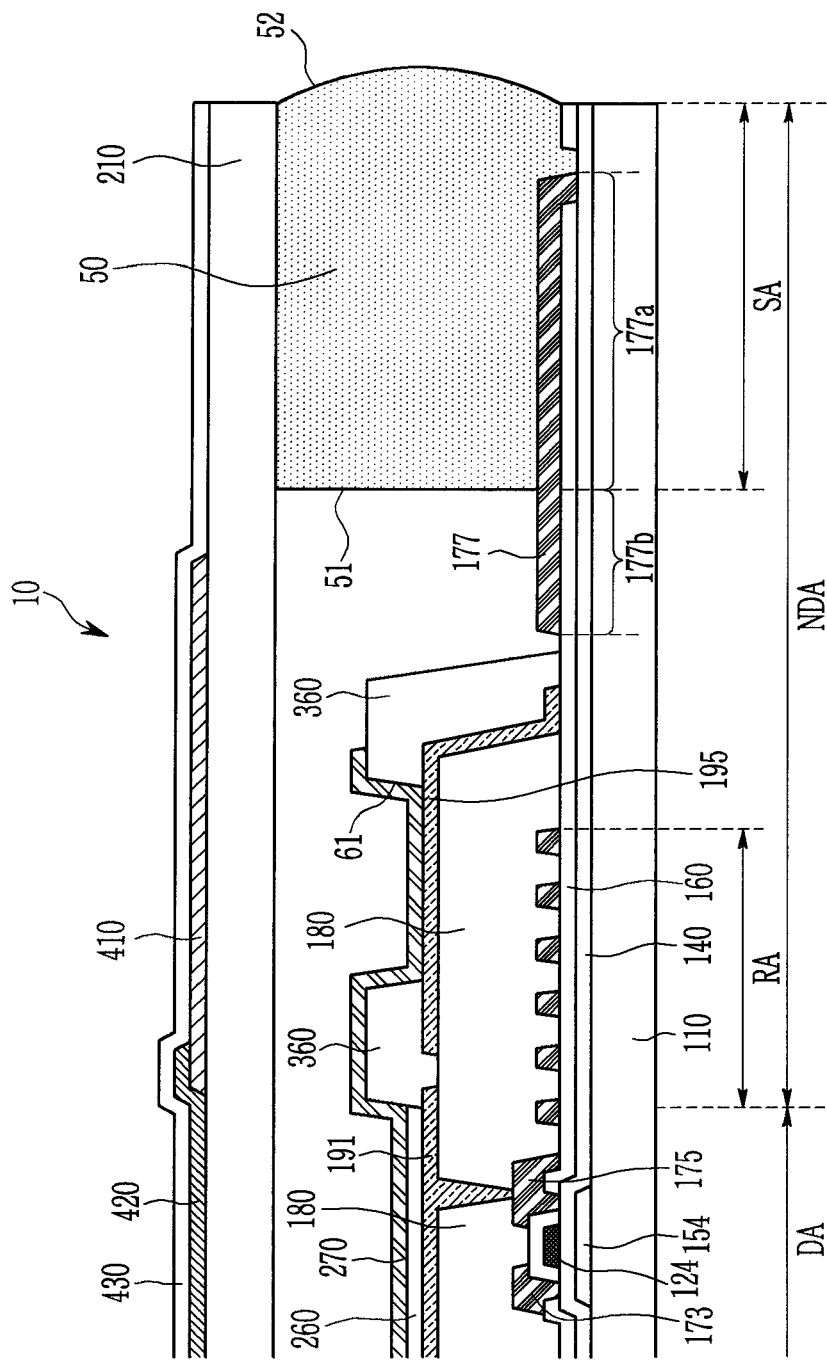
FIG. 8 is a cross-sectional view illustrating an example of a cross-section taken along the line VIII-VIII' in FIG. 7.

FIG. 7 is a layout view schematically illustrating a display device according to an exemplary embodiment of the present invention. FIG. 8 is a cross-sectional view illustrating an example of a cross-section taken along the line VIII-VIII' in FIG. 7.

Referring to FIG. 7 and FIG. 8, no opening is formed at the second portion 177b of the common voltage transfer line 177, which does not overlap the sealant 50, at the upper left and right corner portions CL and CR of the display device 10. However, the connecting member 195 is formed to not be connected to the common voltage transfer line 177. For example, the connecting member 195 may be separated from the common voltage transfer line 177 in a plan view, at the corner portions CL and CR. Accordingly, the heat applied when the sealant 50 is formed may be prevented or substantially prevent from being conducted to the planarization layer 180 or the pixel definition layer 360 through the connecting member 195, thereby suppressing the outgasing of the planarization layer 180 or the pixel definition layer 360. For example, as illustrated in FIG. 3, the connecting member 195 is connected with the common voltage transfer line 177 to apply a common voltage to the common electrode 270, in a region other than the left and right corner portions CL and CR.

Similarly, for example, in the region other than the left and right corner portions CL and CR, as illustrated in FIG. 3, the connecting member 195 may be connected with the common voltage transfer line 177 to receive a common voltage. For example, as illustrated in FIG. 4, the planarization layer 180 may be removed in a region adjacent to the sealant 50 at the upper side of the display device 10.

Figure 9:
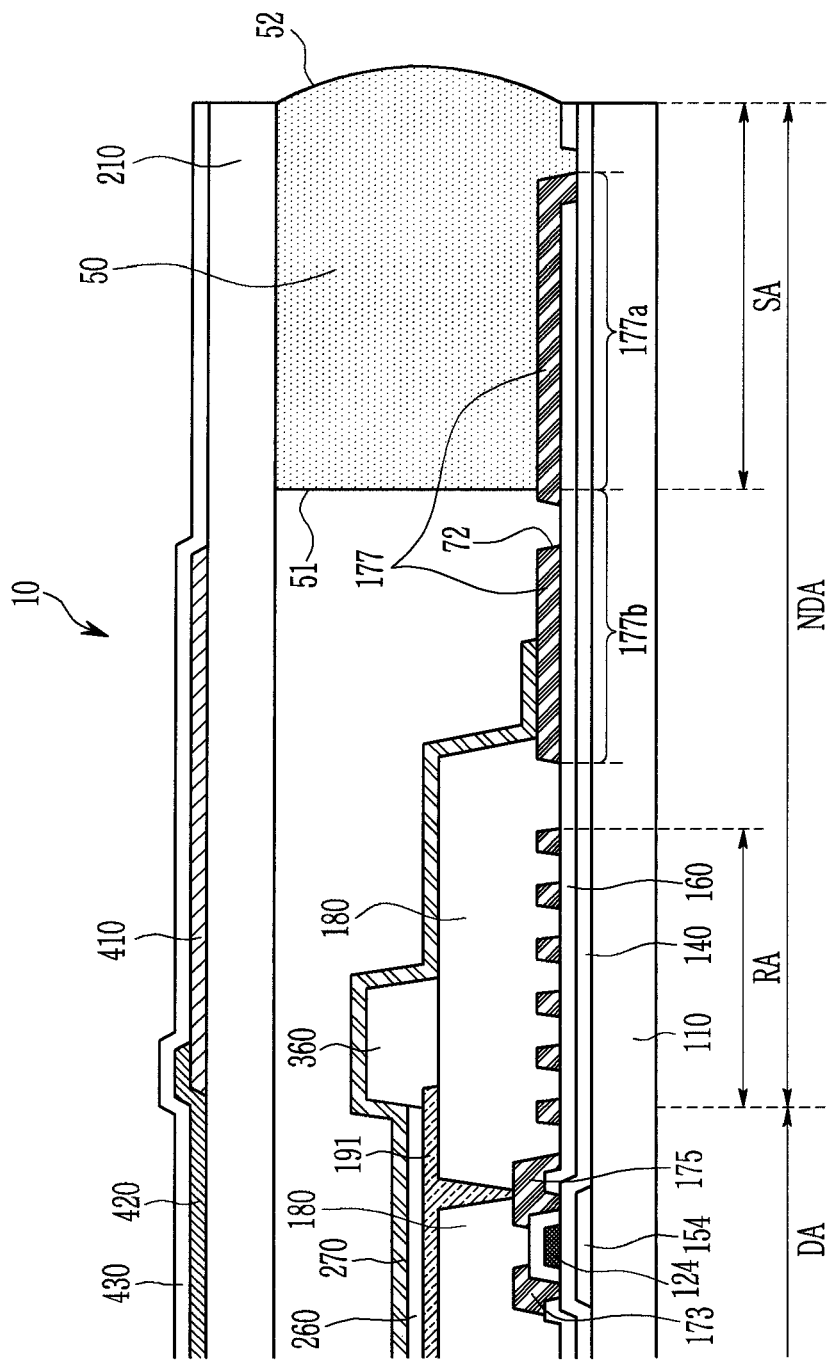
FIG. 9 is a cross-sectional view illustrating an example of a cross-section taken along the line II-II' in FIG. 1.

FIG. 9 is a cross-sectional view illustrating an example of a cross-section taken along the line II-II' in FIG. 1.

Referring to FIG. 9, unlike the exemplary embodiment of FIG. 2, the display device 10, according to some embodiments, does not include the connecting member 195, and the common electrode 270 is directly connected with the common voltage transfer line 177. Because the opening 72 is formed at the second portion 177b of the common voltage transfer line 177 at the upper left and right corner portions CL and CR of the display device 10, the heat applied by the laser may be suppressed from being conducted to the common electrode 270 or the planarization layer 180.

Figure 10:
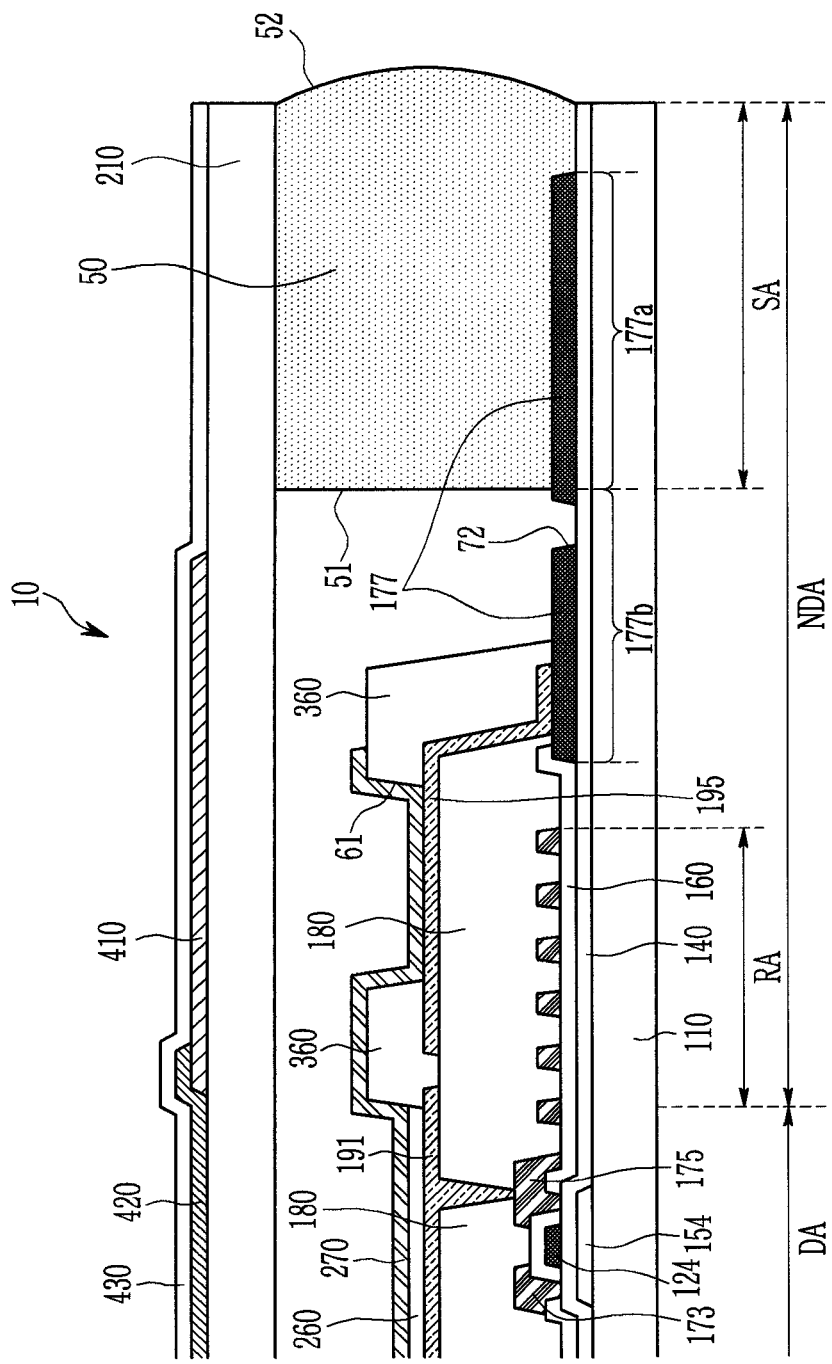
FIG. 10 is a cross-sectional view illustrating an example of a cross-section taken along the line II-II' in FIG. 1.

FIG. 10 is a cross-sectional view illustrating an example of a cross-section taken along the line II-II' in FIG. 1.

Referring to FIG. 10, unlike the aforementioned exemplary embodiments, the common voltage transfer line 177 may be formed of a gate conductor according to some examples. Accordingly, the common voltage transfer line 177 may be disposed at a same layer as that of the gate electrode 124 of the transistor to have a lower surface that contacts the gate insulating layer 120. For example, the common voltage transfer line 177 may be formed together with the gate electrode 124 by forming a conductive layer on the gate insulating layer 140 and then patterning it through a photolithography process.

Further, in the specification, the phrase "in a plan view" means when an object portion is viewed from above, and the phrase "in a cross-section" means when a cross-section taken by vertically cutting an object portion is viewed from the side.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art. Further, a specific quantity or range recited in this written description or the claims may also encompass the inherent variations in measured or calculated values that would be recognized by those of ordinary skill in the art.

As used herein, the terms "use," "using," and "used" may be considered synonymous with the terms "utilize," "utilizing," and "utilized," respectively.

While this invention has been described in connection with what is presently considered to be practical exemplary embodiments, it is to be understood that the invention is not limited to the disclosed embodiments, but, on the contrary, is intended to cover various suitable modifications and equivalent arrangements included within the spirit and scope of the invention as defined by the appended claims and equivalents thereof.

What is claimed is:

1. A display device comprising:
    a first substrate having a display area and a non-display area around the display area;
    a light-emitting element in the display area and comprising a pixel electrode, a common electrode, and an emission member between the pixel electrode and the common electrode;
    a common voltage transfer line in the non-display area and electrically connected to the common electrode, the common voltage transfer line including an inner side closer to the display area and an outer side opposing to the inner side;
    a second substrate opposite the first substrate;
    a sealant in the non-display area between the first substrate and the second substrate, the sealant surrounding the display area,
    wherein the common voltage transfer line comprises a first portion overlapping the sealant and a second portion positioned between the sealant and the display area and not overlapping the sealant, and
    wherein the second portion has a cut-out portion recessed from the inner side of the common voltage transfer line; and
    a connecting member connected with the common voltage transfer line and the common electrode, wherein the connecting member is separated from the common voltage transfer line in a plan view at a corner portion of the first substrate where the cut-out is present.

2. The display device of claim 1, wherein the first substrate comprises a first end portion and a second end portion at opposite sides of the first substrate with the display area therebetween,
- wherein the display device further comprises a pad portion at the first end portion, and
- wherein the cut out portion is at a corner portion of the first substrate corresponds to opposite end portions of the second end portion.

3. The display device of claim 2, wherein the cut-out portion has a curved planar shape.

4. The display device of claim 2, wherein the common voltage transfer line comprises a portion that is curvedly formed in a plan view at the corner portion.

5. The display device of claim 2, further comprising:
- a connecting member connected with the common voltage transfer line and the common electrode.

6. The display device of claim 5, wherein the connecting member is at a same layer as that of the pixel electrode, and
- wherein the display device further comprises a planarization layer on the first substrate and below the connecting member and the pixel electrode.

7. The display device of claim 6, wherein the planarization layer does not overlap the common voltage transfer line at the second end portion.

8. The display device of claim 6, further comprising:
- a pixel definition layer below the common electrode and on the connecting member and the pixel electrode.

9. The display device of claim 6, wherein the connecting member is not connected with the common voltage transfer line at the corner portion.

10. The display device of claim 5, further comprising:
- a touch electrode and a touch signal line on the second substrate,
- wherein the touch signal line overlaps the connecting member.

11. The display device of claim 1, wherein a surface of the sealant facing an outside of the display device protrudes from edges of the first substrate and the second substrate.

12. The display device of claim 1, further comprising:
- a transistor in the display area and connected with the pixel electrode of the light-emitting element,
- wherein the common voltage transfer line is at a same layer as that of a source electrode and a drain electrode of the transistor.

13. The display device of claim 1, further comprising:
- a transistor in the display area and connected with the pixel electrode of the light-emitting element,
- wherein the common voltage transfer line is disposed at a same layer as that of a gate electrode of the transistor.

14. A display device comprising:
- a first substrate comprising a display area and a non-display area around the display area, the non-display area comprising a first end portion and a second end portion at opposite sides of the first substrate with the display area therebetween;
- a light-emitting element in the display area and comprising a pixel electrode, a common electrode, and an emission member between the pixel electrode and the common electrode;
- a common voltage transfer line in the non-display area and electrically connected to the common electrode;
- a connecting member in the non-display area and connected with the common electrode and the common voltage transfer line, the connecting member electrically connecting the common voltage transfer line and the common electrode, and transmitting a common voltage from the common voltage transfer line to the common electrode;
- a pad portion at the first end portion;
- a second substrate facing the first substrate; and
- a sealant in the non-display area between the first substrate and the second substrate, the sealant surrounding the display area,
- wherein the connecting member is in direct contact with the common electrode and is electrically disconnected from the common voltage transfer line at a corner portion of the first substrate corresponding to opposite end portions of the second end portion, and wherein the connecting member is separated from the common voltage transfer line in a plan view at the corner portion.

15. The display device of claim 14, wherein the connecting member is at a same layer as that of the pixel electrode, and
- wherein the display device further comprises a planarization layer on the first substrate and below the connecting member and the pixel electrode.

16. The display device of claim 15, wherein the planarization layer does not overlap the common voltage transfer line at the second end portion.

17. The display device of claim 15, further comprising:
- a pixel definition layer below the common electrode and on the connecting member and the pixel electrode.

* * * * *